(12) United States Patent
Onodera et al.

(10) Patent No.: US 7,803,421 B2
(45) Date of Patent: Sep. 28, 2010

(54) EXTERNAL ELECTRODE FORMING METHOD

(75) Inventors: Ko Onodera, Tokyo (JP); Satoshi Kurimoto, Tokyo (JP); Yoji Tozawa, Tokyo (JP); Shirou Ootsuki, Tokyo (JP)

(73) Assignee: TDK Corporation, Tokyo (JP)

( * ) Notice: Subject to any disclaimer, the term of this patent is extended or adjusted under 35 U.S.C. 154(b) by 960 days.

(21) Appl. No.: 11/636,622

(22) Filed: Dec. 11, 2006

(65) Prior Publication Data

US 2007/0138127 A1    Jun. 21, 2007

(30) Foreign Application Priority Data

Dec. 15, 2005    (JP)    ............................ P2005-361847

(51) Int. Cl.
*B05D 5/12*    (2006.01)
*B05D 1/18*    (2006.01)
*H01G 7/00*    (2006.01)

(52) U.S. Cl. ...................... 427/79; 427/284; 427/430.1; 29/25.41

(58) Field of Classification Search .................... 427/58, 427/79, 284, 402, 430.1; 29/25.41
See application file for complete search history.

(56) References Cited

U.S. PATENT DOCUMENTS 5,753,299 A     5/1998  Garcia et al.
6,270,613 B1 *  8/2001  Nakagawa et al. .......... 156/235
6,509,531 B2    1/2003  Sakai et al.

FOREIGN PATENT DOCUMENTS

JP    A 5-167224    7/1993
JP    60-077099    *  3/1994

(Continued)

OTHER PUBLICATIONS

Office Action issued in counterpart Chinese Patent Application on May 15, 2009.

*Primary Examiner*—Brian K Talbot
(74) *Attorney, Agent, or Firm*—Oliff & Berridge, PLC

(57) ABSTRACT

An element forming an electronic component has a first face and a second face facing each other, and a third face adjacent to each of the first face and the second face. A method of forming an external electrode of the electronic component involves a pre-formation step, first to third formation steps, and an electrode formation step. The pre-formation step is to apply a conductive paste onto the third face and to evaporate at least a part of a liquid contained in the applied conductive paste, to form a precoat portion expected to become a part of a third electrode portion. The first formation step is to apply the conductive paste from a direction opposite to the first face, onto the first face to form a first electrode portion. The second formation step is to apply the conductive paste from a direction opposite to the second face, onto the second face to form a second electrode portion. The third formation step is to apply the conductive paste onto the third face so as to cover the precoat portion, to form the third electrode portion. The electrode formation step is to dry the element to form the external electrode consisting of the first electrode portion, the second electrode portion, and the third electrode portion. The first electrode portion, the second electrode portion, and the third electrode portion are formed so as to connect with each other.

8 Claims, 10 Drawing Sheets

FOREIGN PATENT DOCUMENTS

| | | | |
|---|---|---|---|
| JP | A 6-77099 | | 3/1994 |
| JP | 09-275046 | * | 10/1997 |
| JP | A-09-275046 | | 10/1997 |
| JP | A-11-251204 | | 9/1999 |
| JP | A 2000-030916 | | 1/2000 |
| JP | A 2000-269641 | | 9/2000 |
| JP | A 2001-267453 | | 9/2001 |
| JP | A 2002-151367 | | 5/2002 |
| JP | 2003-077775 | * | 3/2003 |
| JP | A-2004-235377 | | 8/2004 |
| KR | 2000-0046722 | | 7/2000 |

* cited by examiner (a)

(b)

(a)

(b)

(c)

(a)

(b)

(a)

(b)

(a)

(b)

(c)

(d)

EXTERNAL ELECTRODE FORMING METHOD

BACKGROUND OF THE INVENTION

1. Field of the Invention

The present invention relates to a method of forming an external electrode of an electronic component.

2. Related Background Art

One of methods of forming an external electrode of an electronic component is the method described in U.S. Pat. No. 5,753,299. This method is to form external electrodes on an end face of a chip being an element to become an electronic component, and on side faces adjacent to the end face. More specifically, consecutively projecting portions called fingers of a comb-shaped plate are arranged at positions opposite to the end face of the chip, and a conductive paste for formation of external electrodes is applied onto tips of the fingers. Subsequently, the fingers are brought into contact with the chip and are slid in directions perpendicular to the extending direction of the chip to rub the conductive paste onto the chip, thereby forming external electrodes.

SUMMARY OF THE INVENTION

When the external electrodes are formed by rubbing the conductive paste onto the end face of the chip as described above, the external electrodes formed on the side faces are formed by downward flows of the conductive paste. More specifically, the conductive paste scraped off by a ridgeline between the end face and each side face flows down the side face of the chip to form the external electrodes on the side face. For this reason, shapes of the external electrodes formed on the side face of the chip are affected by the viscosity of the conductive paste or the like. However, it is difficult to freely control the viscosity of the conductive paste and it is thus difficult to control the lengths of the external electrodes from the ridgeline on each side face of the chip by adjustment of the viscosity of the conductive paste.

Then the Inventors conducted research from a variety of viewpoints on how to control the length of the external electrode by methods other than the adjustment of viscosity of the conductive paste. As an initial step of the research, the Inventors investigated whether the length of the external electrode could be controlled by adjusting an amount of the conductive paste scraped off by the ridgeline between the end face and the side face of the chip. From this investigation, the Inventors found that an increase in the amount of the conductive paste increased the length of an extension of the external electrode on the side face of the chip in the direction away from the ridgeline and along the side face, but also inevitably increased the width of an extension in the direction along the ridgeline. It is seen from this expertise that a sufficient distance is not always assured between adjacent external electrodes and that it could result in a short circuit between the electrodes.

In the next step of the investigation, the Inventors found that a decrease in the amount of the conductive paste for assuring the distance between adjacent external electrodes resulted in decreasing the downward flow amount and restricting the extension length in the direction away from the ridgeline of the external electrode and that it could result in failing to assure a sufficient area of the external electrode. After further research, the Inventors discovered that when the external electrode was formed by scraping off the conductive paste by the ridgeline as described, the state of the external electrode on the side face was affected by the level of the downward flow of the conductive paste, the shape thereof was sometimes unstable, and, when the chip was mounted on a substrate, it could cause the Manhattan phenomenon.

An object of the present invention is therefore to provide a method of forming an external electrode of an electronic component, by which the external electrode can be formed on a stable basis.

An external electrode forming method according to the present invention is a method of forming an external electrode of an electronic component, which is to form a first electrode portion, a second electrode portion, and a third electrode portion so as to connect with each other, on a first face and a second face facing each other in an element forming the electronic component, and on a third face adjacent to each of the first face and the second face, the method comprising: a pre-formation step of applying a conductive paste onto the third face, and evaporating at least a part of a liquid contained in the applied conductive paste, to form a precoat portion expected to become a part of the third electrode portion; a first formation step of applying the conductive paste from a direction opposite to the first face, onto the first face to form the first electrode portion; a second formation step of applying the conductive paste from a direction opposite to the second face, onto the second face to form the second electrode portion; a third formation step of applying the conductive paste onto the third face so as to cover the precoat portion, to form the third electrode portion; and an electrode formation step of drying the element to form the external electrode consisting of the first electrode portion, the second electrode portion, and the third electrode portion.

According to the present invention, the conductive paste is applied onto each of the first face and the second face of the element, from the direction opposite to each face, whereby the first electrode portion and the second electrode portion can be stably formed in an intended shape on the respective faces. After the precoat portion is formed, the conductive paste is applied so as to cover the precoat portion, to form the third electrode portion; therefore, the third electrode portion is prevented from flowing off and spreading in a wet state out of the precoat portion, and it is feasible to secure a sufficient thickness of the third electrode portion. Since the third electrode portion is prevented from spreading, a plurality of electrodes can be formed at a narrow pitch.

Preferably, the pre-formation step comprises performing preliminary drying to evaporate a part of the liquid contained in the conductive paste applied onto the third face and not to evaporate the rest, thereby forming the precoat portion.

This makes adhesion of the conductive paste particularly good in the region where the liquid is not evaporated, and thus a sufficient thickness of the third electrode portion can be secured more appropriately. Since the peripheral region of the precoat portion is easy to dry, the peripheral region first dried functions to prevent the third electrode portion from flowing off and spreading in a wet state out of the precoat portion, because of the difference of wettability.

Preferably, the third formation step is carried out prior to the first formation step and the second formation step. The external electrode can be appropriately formed regardless of the order of the first formation step, the second formation step, and the third formation step, but the external electrode can be more appropriately formed when the third formation step is carried out prior to the first formation step and the second formation step. Particularly, since the third electrode portion formed first functions as a bank, the conductive paste of the first electrode portion and the second electrode portion is prevented from flowing onto the third face and spreading on the third face. Therefore, a sufficient electrode thickness is secured at each corner of the element.

Preferably, the method further comprises a step of preparing a jig having a groove into which the element can be inserted; a preparation step of filling the groove of the jig with the conductive paste; and a removal step of removing the filled conductive paste while leaving the conductive paste at least along wall surfaces of the groove, wherein the first formation step comprises inserting the element into the groove and moving the element so as to bring the first face closer to a wall surface of the groove, thereby forming the first electrode portion, and wherein the second formation step comprises moving the element so as to bring the second face closer to another wall surface of the groove, thereby forming the second electrode portion.

In this method, the conductive paste remaining along the wall surfaces of the groove into which the element can be inserted, is attached to the element, whereby the first electrode portion and the second electrode portion can be stably formed more easily.

Preferably, the first formation step comprises forming the first electrode portions alongside at a plurality of locations on the first face, the second formation step comprises forming the second electrode portions at positions corresponding to the respective first electrode portions formed alongside at the plurality of locations, and the third formation step comprises forming the third electrode portions so as to connect with the respective first electrode portions formed alongside at the plurality of locations and connect with the respective second electrode portions formed at the corresponding positions.

In this method, the first electrode portions and the second electrode portions are formed alongside corresponding to each other at the plurality of locations, and the third electrode portions are formed so as to connect with the corresponding first electrode and second electrode portions, whereby the stable external electrodes can be efficiently formed.

Preferably, the method further comprises a step of preparing a jig in which a plurality of platelike members, each being provided with a groove into which the element can be inserted, are arranged along each other; a preparation step of filling each of the grooves with the conductive paste so as to cover the grooves of the respective platelike members across the grooves; and a removal step of removing the conductive paste present between the plurality of platelike members and thereby leaving the conductive paste present in each of the grooves, at least along wall surfaces of each groove, wherein the first formation step comprises inserting the element into the grooves so as to extend across the grooves and moving the element so as to bring the first face closer to one wall surfaces of the respective grooves, thereby forming the first electrode portions, and wherein the second formation step comprises moving the element so as to bring the second face closer to other wall surfaces of the respective grooves, thereby forming the second electrode portions.

In this method, the conductive paste is filled in the grooves of the platelike members arranged along each other, and thereafter the conductive paste is removed from the regions between the platelike members, whereby the excessive conductive paste in the grooves flows out. Therefore, the conductive paste can be left along the wall surfaces of the respective grooves in the plurality of platelike members.

The present invention enables stable formation of the first electrode portion, the second electrode portion, and the third electrode portion and thus enables stable formation of the external electrode.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The expertise of the invention can be readily understood in view of the following detailed description with reference to the accompanying drawings presented by way of illustration only. Subsequently, an embodiment of the present invention will be described with reference to the accompanying drawings. The same portions will be denoted by the same reference symbols as much as possible, without redundant description.

An external electrode forming method, which is an embodiment of the present inventions will be described. The external electrode forming method of the present embodiment is outlined as follows. First, an application bed (jig) with grooves is prepared, and a conductive paste is attached along wall faces and bottom faces of the grooves. Thereafter, a chip (element) is put into the grooves and moved vertically and horizontally to form external electrodes on an end face (third face) and on two side faces (first face and second face) of the chip. Subsequently, the external electrode forming method will be detailed below.

Figure 1:
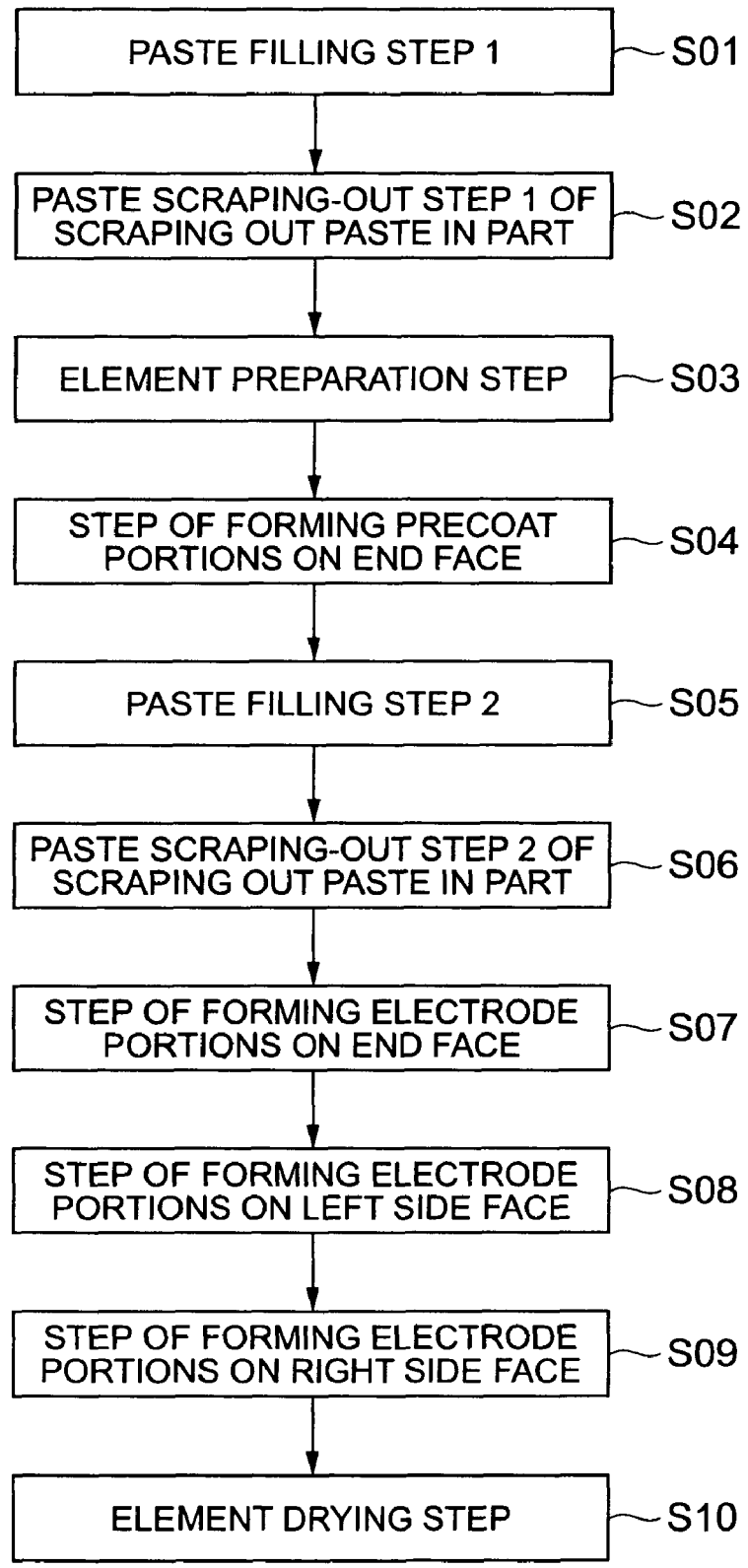
FIG. 1 is a drawing showing a procedure of an external electrode forming method as an embodiment of the present invention.

FIG. 1 is a drawing for explaining the procedure of the external electrode forming method of the present embodiment. FIGS. 2 to 5 are perspective views of the chip and application bed, and drawings showing states of respective steps in the external electrode forming method. FIGS. 6 to 10 are drawings showing more detailed states of application of the conductive paste onto the chip. The method will be described along the flow shown in FIG. 1 and with reference to FIGS. 2 to 10 on an as-needed basis.

As shown in FIG. 1, the external electrode forming method of the present embodiment involves a paste filling step 1 (step S01), a paste scraping-out step 1 of scraping out the paste in part (step S02), an element preparation step (step S03), a step of forming precoat portions on the end face (step S04, preformation step), a paste filling step 2 (step S05), a paste scraping-out step 2 of scraping out the paste in part (step S06), a step of forming electrode portions on the end face (step S07, third formation step), a step of forming electrode portions on the left side face (step S08, first formation step), a step of forming electrode portions on the right side face (step S09, second formation step), and an element drying step (step S10, electrode formation step).

Figure 2:
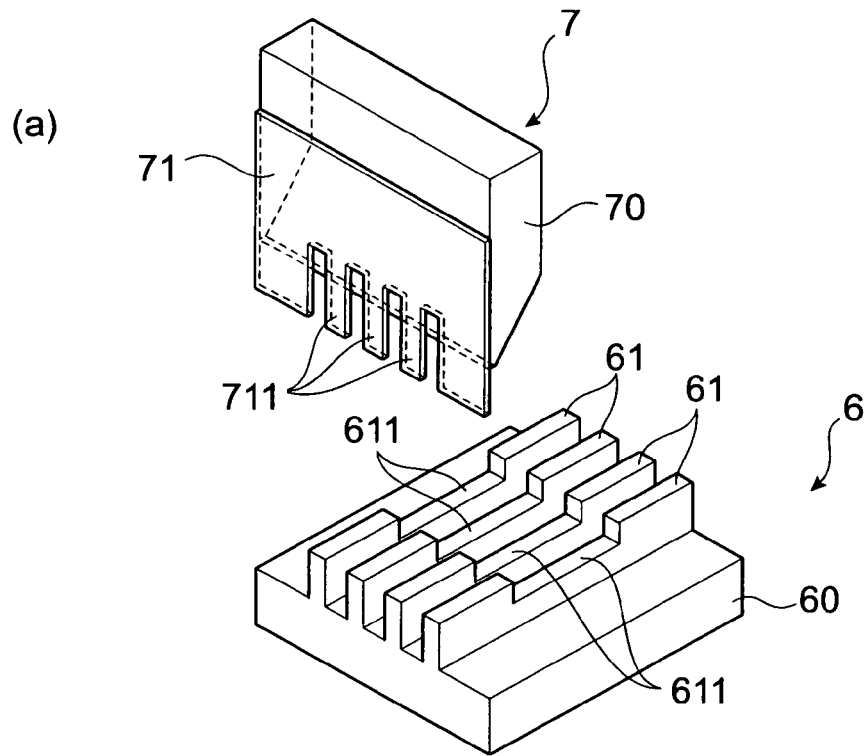
FIGS. 2 to 10 are drawings for explaining the external electrode forming method as an embodiment of the present invention.
Figure 2:
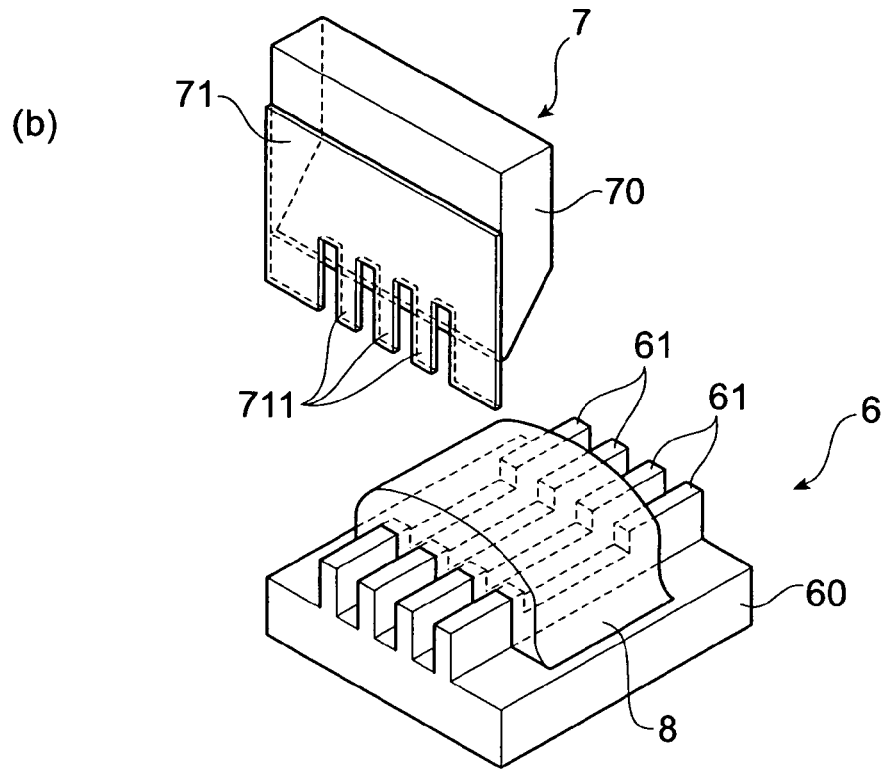

The first step is to prepare the application bed 6 and blade 7 (cf. (a) in FIG. 2). The application bed 6 is comprised of a base 60 and four platelike members 61. The platelike members 61 are attached to the base 60 so as to be parallel to each other at intervals. Grooves 611 are formed at the same position and in a thickness direction in the respective platelike members 61.

The blade 7 is comprised of a base 70 and a scraper 71. Teeth 711 are formed in the scraper 71. The teeth 711 are formed so as to be inserted into between the platelike members 61 of the application bed 6.

Subsequently, the conductive paste 8 is delivered so as to cover across the grooves 611 of the respective platelike members 61 in the application bed 6 (cf. (b) in FIG. 2). Therefore, the conductive paste 8 is filled in the grooves 611 of the respective platelike members 61 (step S01 in FIG. 1, preparation step).

Figure 3:
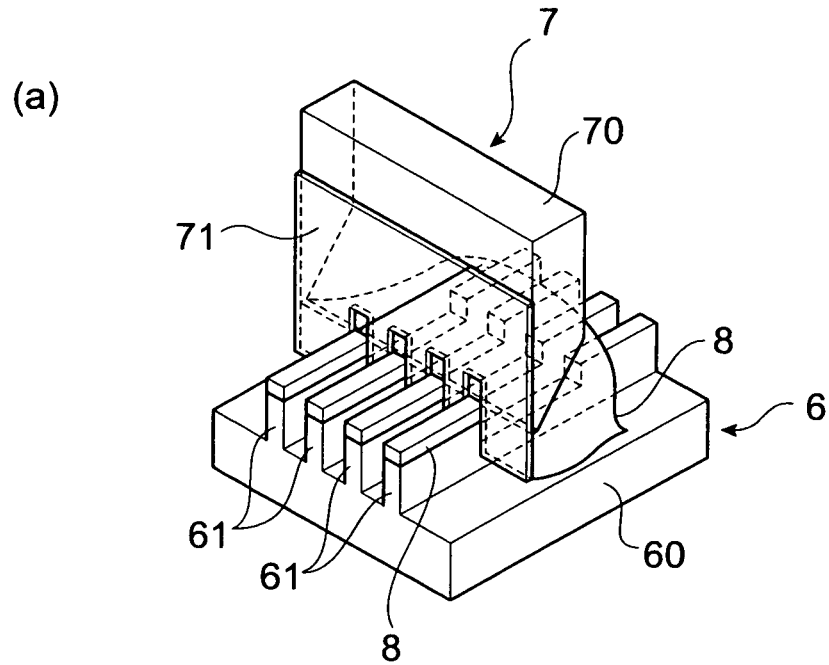
Figure 3:
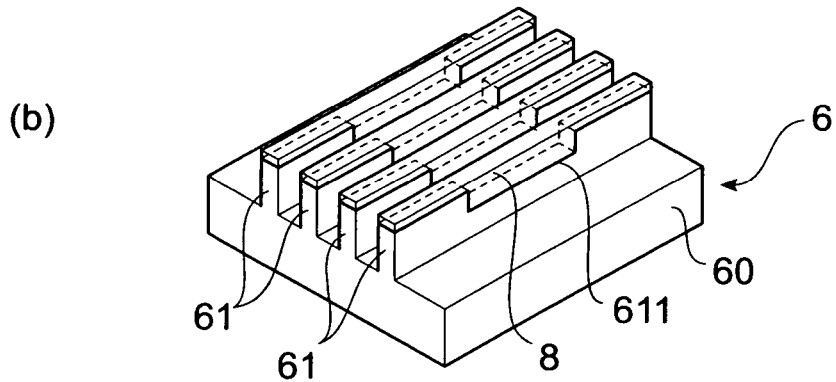
Figure 3:
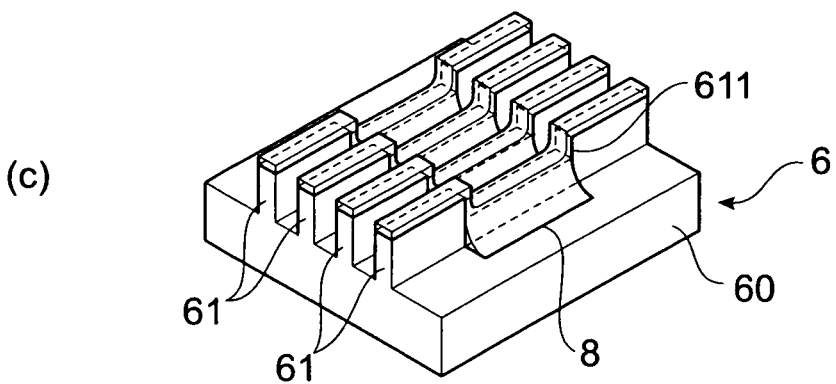

Subsequently, relative movement is effected between the blade 7 and the application bed 6 while the blade 7 and the application bed 6 are kept in contact with each other ((a) in FIG. 3). This movement causes each of the teeth 711 in the blade 7 to be inserted into between the platelike members 61 of the application bed 6. The blade 7 and the application bed 6 are formed so that a clearance is made between the upper ends of the platelike members 61 and the roots located between the teeth 711, in a state in which the tips of the teeth 711 are in contact with the base 60 of the application bed 6. Therefore, the conductive paste 8 is pushed out through the clearance onto the platelike members 61.

Subsequently, the blade 7 is moved along the platelike members 61 to scrape out the conductive paste 8 present between the platelike members 61 ((b) in FIG. 3, removal step). Since the conductive paste 8 is fluid, the conductive paste 8 remaining in the grooves 611 of the platelike members 61 flows out to between the platelike members 61 ((c) in FIG. 3). Therefore, the conductive paste 8 remains along each of the grooves 611 of the platelike members 61 (step S02 in FIG. 1). In this case, the thickness of the conductive paste 8 remaining along each groove 611 is approximately 10 μm.

Figure 4:
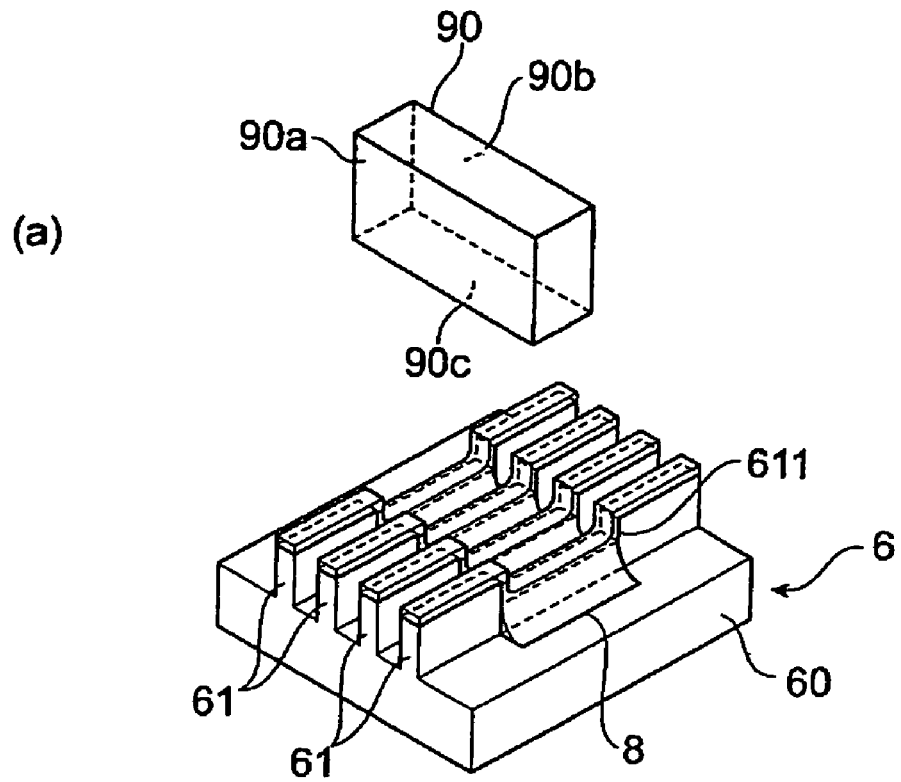
Figure 4:
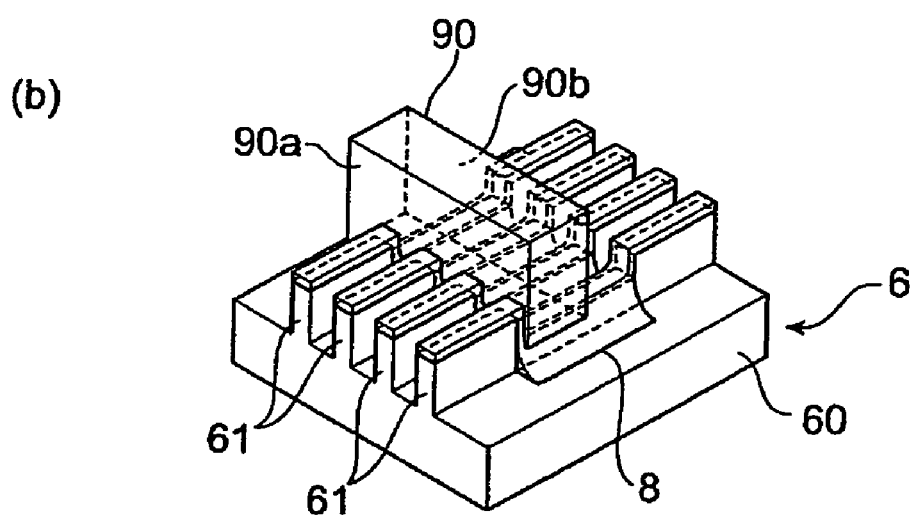

Subsequently, a chip 90 is prepared ((a) in FIG. 4). The chip 90 has a left side face 90a, a right side face 90b, and an end face 90c. This chip 90 is located so as to stretch across the grooves 611 of the respective platelike members 61. The chip 90 is held as pasted to an adhesive tape (not shown) provided on a holding plate (not shown) (step S03 in FIG. 1).

Step S04 in FIG. 1 will be described with reference to FIG. 6. As the chip 90 is brought close to the application bed 6 from the state shown in (a) in FIG. 6, the chip 90 comes into contact with the platelike members 61 as shown in (b) in FIG. 6.

Figure 6:
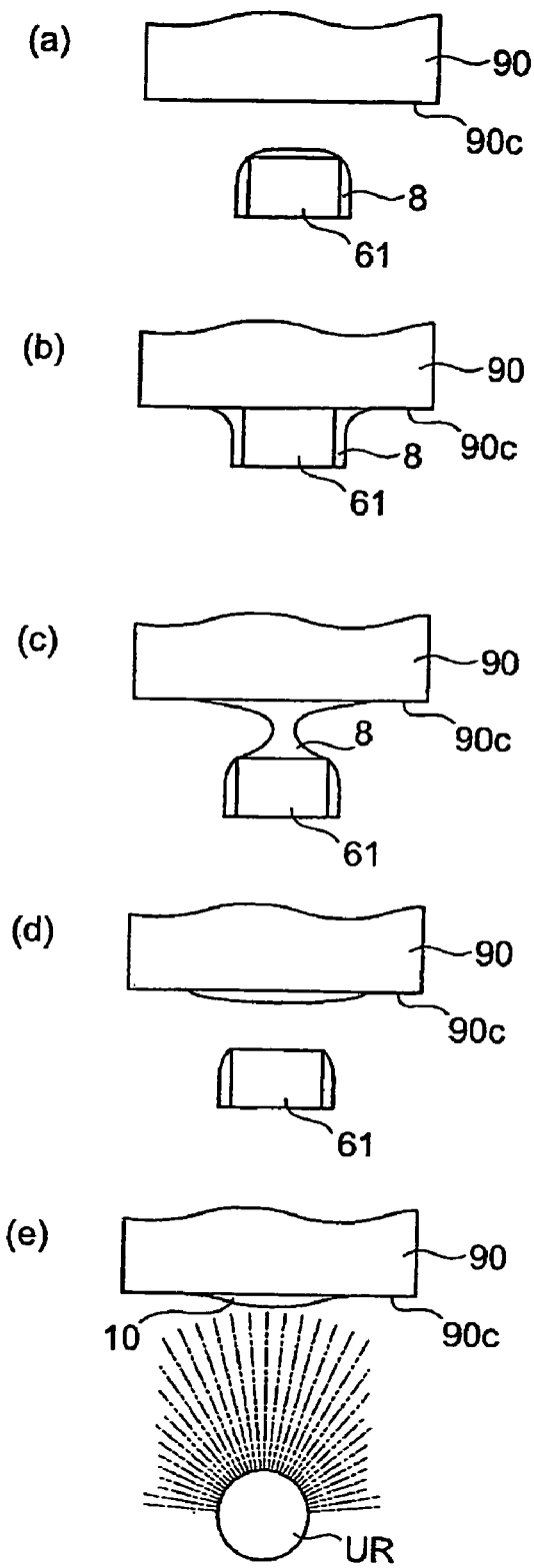
Figure 7:
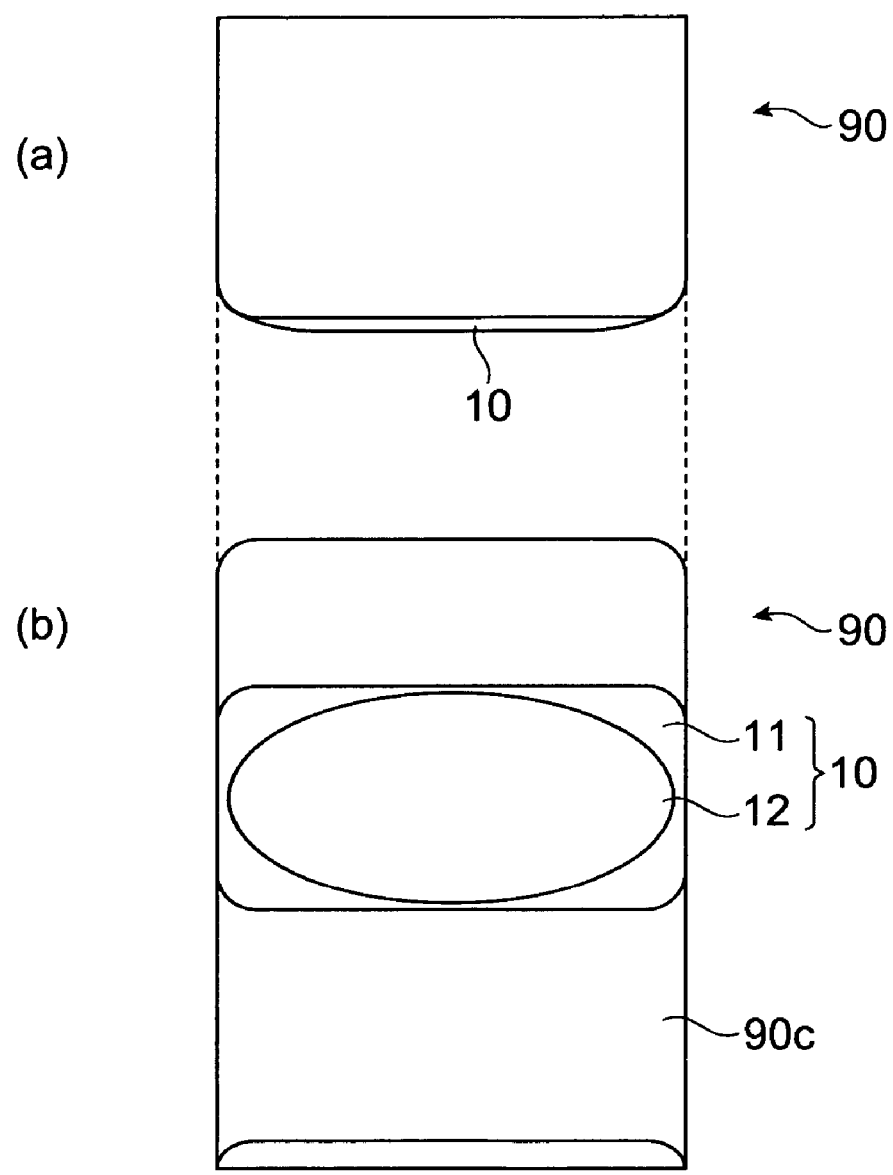

Thereafter, as shown in (c) in FIG. 6, the chip 90 is moved away from the platelike members 61. This results in attaching the conductive paste 8 to the end face 90c of the chip 90 (cf. (d) in FIG. 6). Subsequently, a far-infrared source UR is used to irradiate the conductive paste 8 on the end face 90c with far-infrared rays to effect pre-drying. The pre-drying is to evaporate a part of a liquid in the conductive paste 8 attached to the end face 90c and thereby to dry only the peripheral region. The pre-drying results in forming precoat portions 10 each including an undried portion 12 and a dried portion 11, as shown in (a) and (b) in FIG. 7. FIG. 7 (b) is a view of the chip 90 from the direction opposite to the end face 90c, and FIG. 7 (a) a view of the chip 90 from the direction opposite to the side face 90a.

Subsequently, in the same manner as shown in (b) in FIG. 2, the conductive paste 8 is delivered so as to cover across the grooves 611 of the respective platelike members 61 in the application bed 6. Therefore, the conductive paste 8 is filled in the grooves 611 of the respective platelike members 61 (step S05 in FIG. 1, preparation step).

Subsequently, in the same manner as shown in (a)-(c) in FIG. 3, relative movement is effected between the blade 7 and the application bed 6 while the blade 7 and the application bed 6 are kept in contact with each other ((a) in FIG. 3). This movement results in inserting each of the teeth 711 of the blade 7 into between the platelike members 61 of the application bed 6. A clearance is made between the upper ends of the platelike members 61 and the roots located between the teeth 711, in a state in which the tips of the teeth 711 are in contact with the base 60 of the application bed 6. Therefore, the conductive paste 8 is pushed out through the clearance onto the platelike members 61.

Subsequently, the blade 7 is moved along the platelike members 61 to scrape out the conductive paste 8 existing between the platelike members 61 ((b) in FIG. 3, removal step). Since the conductive paste 8 is fluid, the conductive paste 8 remaining in the grooves 611 of the platelike members 61 flows out to between the platelike members 61 ((c) in FIG. 3). Therefore, the conductive paste 8 remains along each of the grooves 611 of the platelike members 61 (step S06 in FIG. 1). In this case, the thickness of the conductive paste 8 remaining along each groove 611 is approximately 100 μm.

The step S07 in FIG. 1 will be described with reference to FIG. 8. As shown in (a) in FIG. 8, the chip 90 is brought close to the application bed 6. As the chip 90 is brought close to the application bed 6 in that state, the chip 90 comes into contact with the platelike members 61 as shown in (b) in FIG. 8.

Figure 8:
Figure 8:
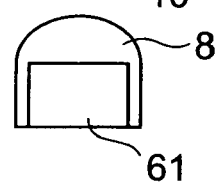
Figure 8:
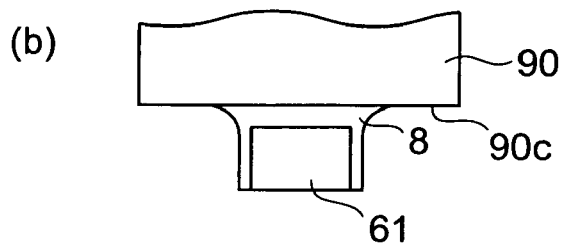
Figure 8:
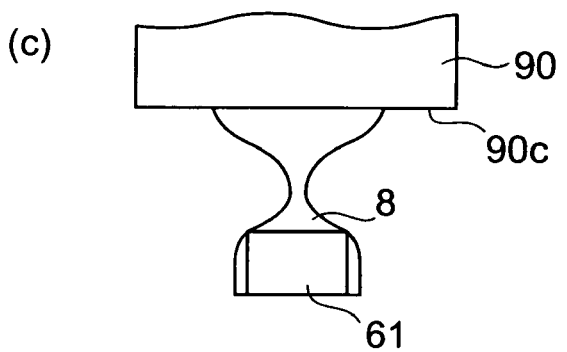
Figure 8:
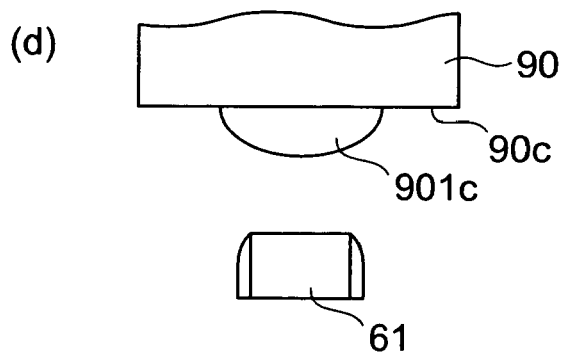
Figure 9:
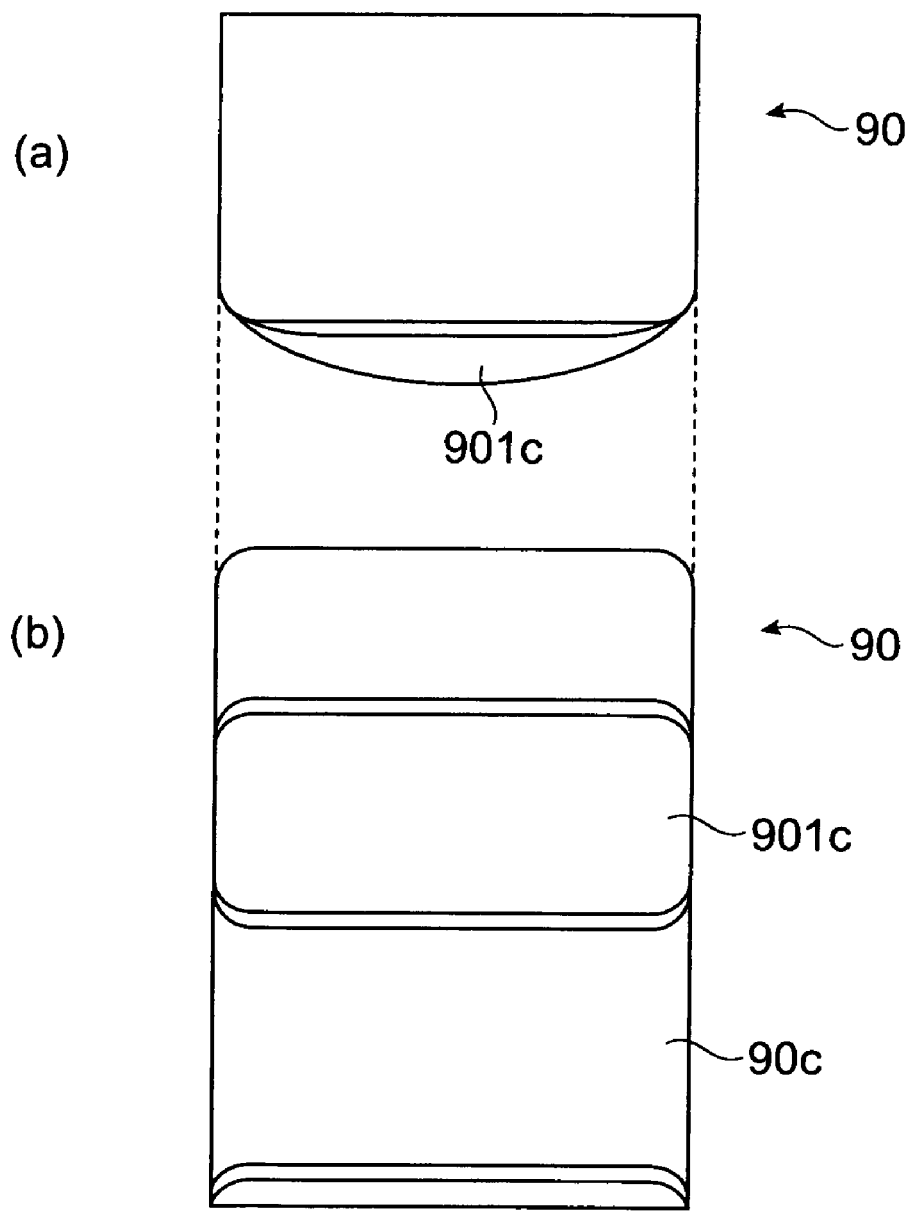
Figure 10:
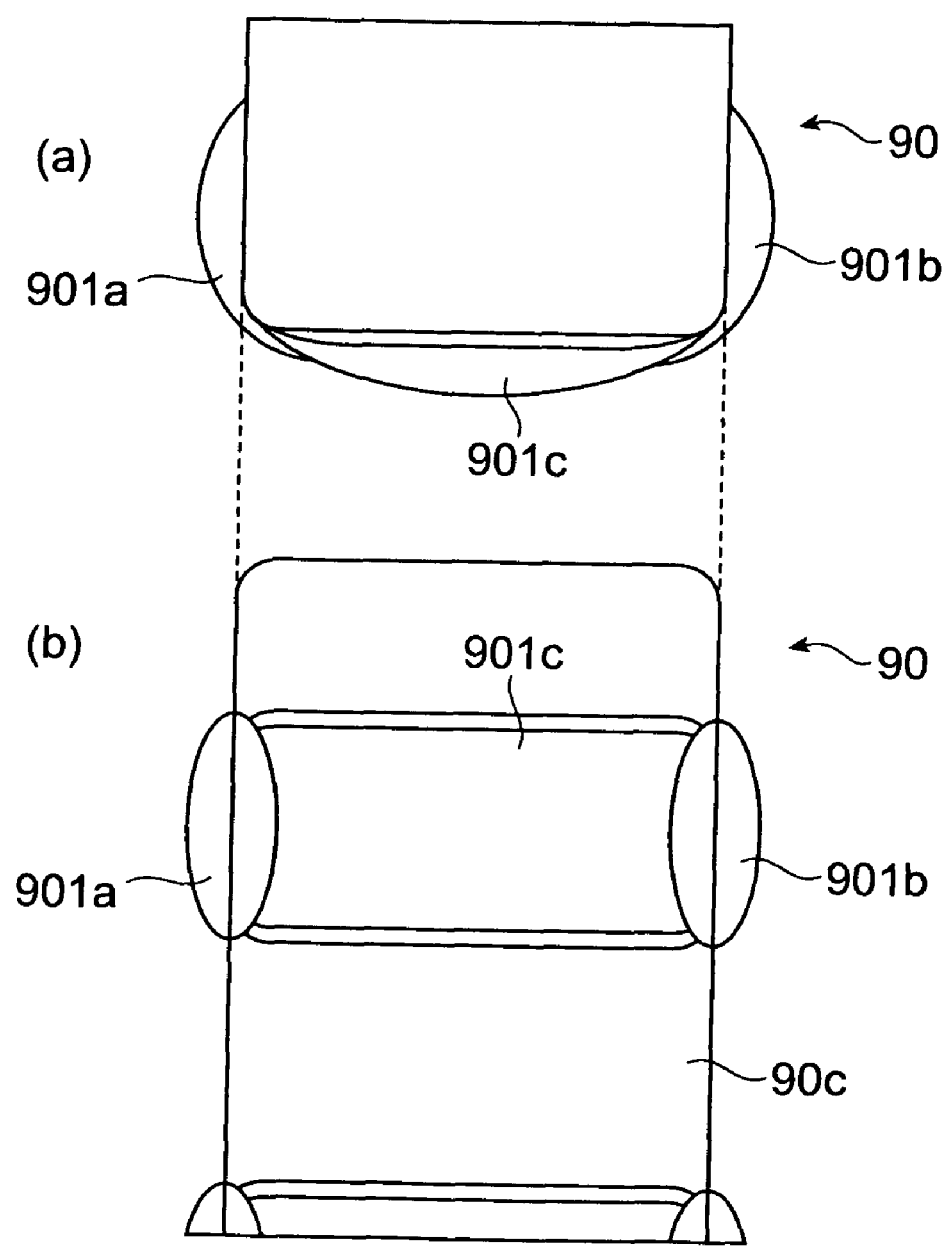

Thereafter, as shown in (c) in FIG. 8, the chip 90 is moved away from the platelike members 61. This results in attaching the conductive paste 8 so as to cover the precoat portions 10 on the end face 90c of the chip 90 (cf. (d) in FIG. 8). As shown in (a) and (b) in FIG. 9, the conductive paste is attached so as to cover the precoat portions 10, to form electrode portions 901c (third electrode portions). Since the conductive paste is more likely to dry on the dried portion 11 being the peripheral region of each precoat portion 10, the dried portion 11 (peripheral region) dried first functions to prevent each electrode portion 901c from flowing off and spreading in a wet state out of the precoat portion 10, because of the difference of wettability. FIG. 9 (b) is a view of the chip 90 from the direction opposite to the end face 90c, and FIG. 9 (a) a view of the chip 90 from the direction opposite to the side face 90a.

Returning to FIG. 4, relative movement is effected between the chip 90 and the application bed 6 so as to bring the side face 90a of the chip 90 into contact with the grooves 611 of the respective platelike members 61 ((b) in FIG. 4). Since the side face 90a of the chip 90 is brought into contact with the grooves 611 of the four platelike members 61, four electrode portions 901a (first electrode portions) are formed (step S08 in FIG. 1). Each of these four electrode portions 901a connects with one of the four electrodes 901c.

Figure 5:
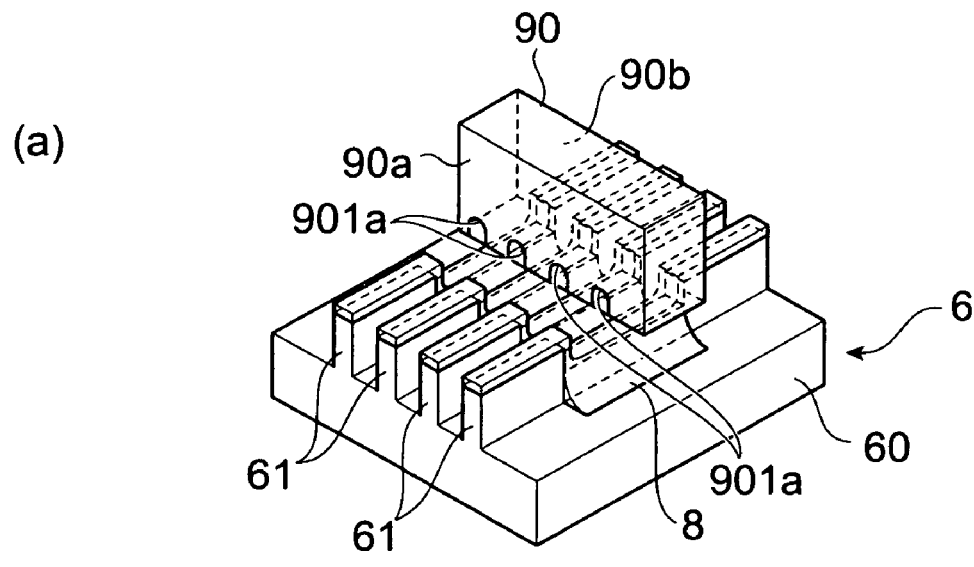
Figure 5:
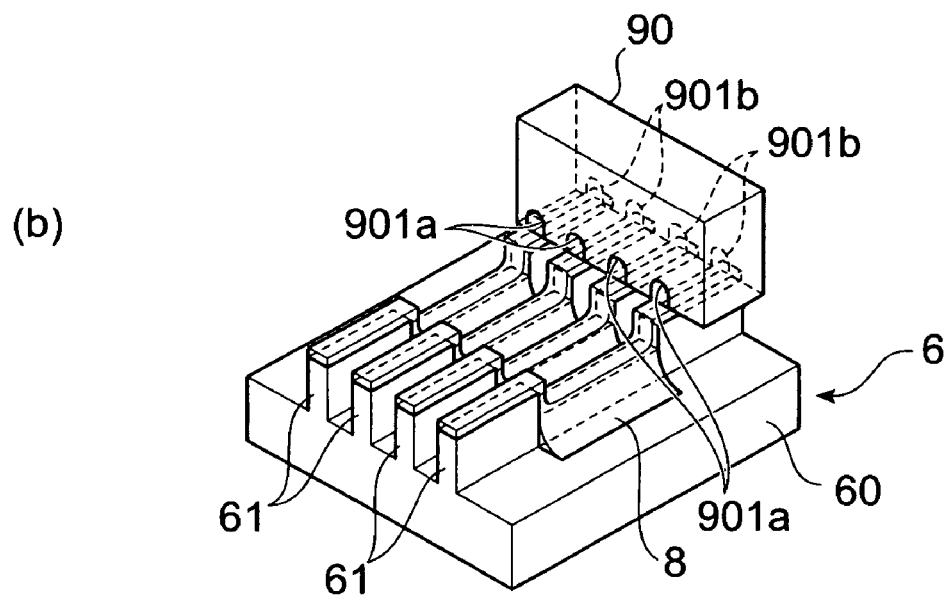

Subsequently, relative movement is effected between the chip 90 and the application bed 6 so as to bring the side face 90b of the chip 90 into contact with the grooves 611 of the respective platelike members 61 ((a) in FIG. 5). Since the side face 90b of the chip 90 is brought into contact with the grooves 611 of the four platelike members 61, four electrode portions 901b (second electrode portions) are formed (step S09 in FIG. 1). Each of these four electrode portions 901b connects with one of the four electrodes 901c.

Subsequently, relative movement is effected so as to separate the chip 90 and the application bed 6 from each other (in the vertical direction in the drawing) ((b) in FIG. 5). Subsequently, the chip 90 is dried, whereby the external electrodes are formed thereon, as shown in (a) and (b) in FIG. 10, each in a configuration in which the electrode portion 901a and the electrode portion 901b connect with the electrode portion 901c between the electrode portions 901a and 901b (step S10 in FIG. 1).

In the present embodiment, as described above, the conductive paste 8 is applied onto each of the side faces 90a, 90b of the chip 90 from the direction opposite to each face, and thus the electrode portions 901a, 901b can be stably formed in the intended shape on the respective side faces 90a, 90b. After the formation of the precoat portions 10, the conductive paste 8 is applied so as to cover the precoat portions 10, to form the electrode portions 901c, and thus the electrode portions 901c are prevented from flowing off and spreading in a wet state out of the precoat portions 10, whereby the sufficient thickness of the electrode portions 901c can be secured. Since the electrode portions 901c are prevented from spreading, a plurality of electrodes can be formed at a narrow pitch.

In the step S04 in FIG. 1, the precoat portions 10 are formed by performing the pre-drying to evaporate a part of the liquid in the conductive paste 8 applied onto the end face 90c, and not to evaporate the rest. This achieves particularly good adhesion of the conductive paste 8 to the undried portions 12 from which the liquid is not evaporated, and therefore the sufficient thickness of the electrode portions 901c can be secured more appropriately. Since the conductive paste is more likely to dry in the dried portion 11 being the peripheral region of each precoat portion 10, the dried portion 11 (peripheral region) dried first functions to prevent the electrode portion 901c from flowing off and spreading in a wet state out of the precoat portion 10, because of the difference of wettability.

In the present embodiment the step S07 is carried out prior to the steps S08, S09 in FIG. 1. The step S07 may also be carried out after the steps S08, S09 to form the external electrodes appropriately. However, when the step S07 is carried out prior to the steps S08, S09, the external electrodes can be formed more appropriately. Particularly, since each electrode portion 901c formed first functions as a bank, it can prevent the conductive paste in the electrode portion 901a and in the electrode portion 901b from flowing onto the end face 90c and spreading over the end face 90c. Therefore, a sufficient electrode thickness is secured at the corners of the element.

In the present embodiment, the conductive paste 8 is filled in the grooves 611 of the platelike members 61 arranged along each other, and thereafter the conductive paste 8 is removed from between the platelike members 61, whereupon the excess conductive paste 8 present in each of the grooves 611 flows out. Therefore, the conductive paste 8 can be left along the wall surfaces of the respective grooves 611 in the platelike members 61.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of forming an external electrode of an electronic component, which is to form a first electrode portion, a second electrode portion, and a third electrode portion so as to connect with each other, on a first face and a second face facing each other in an element forming the electronic component, and on a third face adjacent to each of the first face and the second face, the method comprising:

a pre-formation step of applying a conductive paste onto the third face, and evaporating at least a part of a liquid contained in the applied conductive paste, to form a precoat portion including a dried portion in a peripheral region of the precoat portion that substantially surrounds an undried portion, the precoat portion expected to become a part of the third electrode portion;

a first formation step of applying the conductive paste from a direction opposite to the first face, onto the first face to form the first electrode portion;

a second formation step of applying the conductive paste from a direction opposite to the second face, onto the second face to form the second electrode portion;

a third formation step of applying the conductive paste onto the third face so as to cover the precoat portion, to form the third electrode portion; and an electrode formation step of drying the element to form the external electrode consisting of the first electrode portion, the second electrode portion, and the third electrode portion.

2. A method according to claim 1,
wherein the pre-formation step comprises performing preliminary drying by irradiating the conductive paste with far-infrared rays from a far-infrared source to evaporate a part of the liquid contained in the conductive paste applied onto the third face and not to evaporate the rest, thereby forming the precoat portion.

3. A method according to claim 2,
wherein the third formation step is carried out prior to the first formation step and the second formation step.

4. A method according to claim 1,
wherein the third formation step is carried out prior to the first formation step and the second formation step.

5. A method according to claim 1, further comprising:
a step of preparing a jig having a groove into which the element can be inserted;
a preparation step of filling the groove of the jig with the conductive paste; and
a removal step of removing the filled conductive paste while leaving the conductive paste at least along wall surfaces of the groove,
wherein the first formation step comprises inserting the element into the groove and moving the element so as to bring the first face closer to a wall surface of the groove, thereby forming the first electrode portion, and
wherein the second formation step comprises moving the element so as to bring the second face closer to another wall surface of the groove, thereby forming the second electrode portion.

6. A method according to claim 1,
wherein the first formation step comprises forming the first electrode portions alongside at a plurality of locations on the first face,
wherein the second formation step comprises forming the second electrode portions at positions corresponding to the respective first electrode portions formed alongside at the plurality of locations, and
wherein the third formation step comprises forming the third electrode portions so as to connect with the respective first electrode portions formed alongside at the plurality of locations and connect with the respective second electrode portions formed at the corresponding positions.

7. A method according to claim 1, further comprising:
a step of preparing a jig in which a plurality of plate members, each being provided with a groove into which the element can be inserted, are arranged along each other;

a preparation step of filling each of the grooves with the conductive paste so as to cover the grooves of the respective plate members across the grooves; and a removal step of removing the conductive paste present between the plurality of plate members and thereby leaving the conductive paste present in each of the grooves, at least along wall surfaces of each groove, wherein the first formation step comprises inserting the element into the grooves so as to extend across the grooves and moving the element so as to bring the first face closer to one wall surfaces of the respective grooves, thereby forming the first electrode portions, and wherein the second formation step comprises moving the element so as to bring the second face closer to other wall surfaces of the respective grooves, thereby forming the second electrode portions.

8. A method according to claim 1, wherein the first formation step comprises forming the first electrode portions alongside at a plurality of locations on the first face, wherein the second formation step comprises forming the second electrode portions at positions corresponding to the respective first electrode portions formed alongside at the plurality of locations, and wherein the third formation step comprises forming each of the third electrode portions so as to connect with one different first electrode portion selected from the first electrode portions formed alongside at the plurality of locations and connect with one different second electrode portion selected from the second electrode portions formed alongside at the corresponding positions.

* * * * *